United States Patent
Herring et al.

(10) Patent No.: US 6,552,905 B2
(45) Date of Patent: Apr. 22, 2003

(54) HEAT SINK RETENTION APPARATUS

(75) Inventors: Dean Frederick Herring, Youngsville, NC (US); Joseph Anthony Holung, Wake Forest, NC (US); Beth Frayne Loebach, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/951,927

(22) Filed: Sep. 13, 2001

(65) Prior Publication Data

US 2003/0048610 A1 Mar. 13, 2003

(51) Int. Cl.$^7$ ................................. H05K 7/20
(52) U.S. Cl. ................. 361/704; 165/80.3; 165/185; 257/719; 361/710; 361/715; 248/510; 24/458
(58) Field of Search ................. 165/80.2, 80.3, 165/185; 174/16.3; 257/718–719, 726–727; 361/697, 704, 707, 709–710, 715, 719–721; 248/505, 510; 24/457–458; 267/150, 158, 160

(56) References Cited

U.S. PATENT DOCUMENTS

| | | | |
|---|---|---|---|
| 5,730,210 A | * | 3/1998 | Kou ........................... 165/80.3 |
| 6,104,614 A | * | 8/2000 | Chou et al. ................. 361/704 |
| 6,304,452 B1 | * | 10/2001 | Lo .............................. 361/704 |

* cited by examiner

*Primary Examiner*—Gregory Thompson
(74) *Attorney, Agent, or Firm*—Joseph P. Lally; Martin McKinley

(57) ABSTRACT

A heat sink retention assembly including a spring, a spring retainer, and a spring displacement limiter. The spring retainer maintains the spring in a compressed state in which a contact portion of the spring applies a force to the heat sink. The compressed state is characterized by a predetermined spring displacement and exerted force. The spring displacement limiting mechanism prevents displacement of the compressed spring substantially beyond the predetermined spring displacement. The displacement limiting mechanism may comprise a separate component such as a spacer structure or may be integrated into the configuration of the spring itself. In one spacer structure embodiment, the spacer has a vertical dimension that is determined by the difference between the total spring displacement possible and the predetermined spring displacement required to deliver the predetermined force to the heat sink. When the spacer is placed between a bowed portion of the spring and the heat sink, it contacts both the spring and the heat sink when the spring is in the compressed state thereby preventing additional displacement. Alternatively, the spacer may be sized to leave a small gap between the spacer and the heatsink when the spring is in the compressed state to permit slight movement of the heatsink under mechanical shock.

16 Claims, 4 Drawing Sheets

HEAT SINK RETENTION APPARATUS

BACKGROUND

1. Field of the Present Invention

The present invention generally relates to the field of heat dissipation in data processing systems and more particularly to an assembly for maintaining a heat sink in contact with an electronic device such as an integrated circuit module.

2. History of Related Art

In many data processing systems (computers) having one or more socketed processors, heat is transferred from the processor to a directly attached heat sink to cool the device. A spring is typically used to press the flat surface of the heat sink base against the flat top surface of the processor to facilitate thermal dissipation away from the processor and to hold the assembly in place. As size and weight of heat sinks continue to increase with increases in processor speed and power, maintaining adequate contact force between the chip and the heat sink has become a design challenge. With large heat sinks already in the 300 to 800 gram range, it has become increasingly difficult to satisfy minimum system fragility requirements while also maintaining the contact force below the chip manufacturer specified limits. Improved heat sink to chip retention is needed to avoid a dramatic increase in fragility-related failures such as clip failures, heat sinks falling off processors, and the like.

SUMMARY OF THE INVENTION

The problems identified above are in large: part addressed by a heat sink retention assembly for maintaining a heat sink in contact with an electronic component such as microprocessor or other integrated circuit module. The assembly includes a spring, a spring retainer, and a spring displacement limiter. The spring retainer maintains the spring in a compressed state in which a contact portion of the spring applies a force to the heat sink. The compressed state is characterized by a predetermined spring displacement and exerted force. The spring displacement limiter prevents spring displacement significantly beyond the. predetermined spring displacement. The displacement limiter may comprise a separate component such as a spacer structure or may be integrated into the configuration of the spring itself. In one spacer structure embodiment, the spacer has a vertical dimension that is determined by the difference between the total spring displacement possible and the predetermined spring displacement required to deliver the predetermined force to the heat sink. When the spacer is placed between a bowed portion of the spring and the heat sink, it contacts both the spring and the heat sink when the spring is in the compressed state thereby preventing additional displacement. Alternatively, the spacer may be sized to leave a small gap between the spacer and the heatsink when the spacer is in contact with the bowed portion of the spring and the spring is in the compressed state. This small gap would permit slight, temporary movement of the heatsink in the event of mechanical shock.

BRIEF DESCRIPTION OF THE DRAWINGS

Other objects and advantages of the invention will become apparent upon reading the following detailed description and upon reference to the accompanying drawings in which.

Figure 1:
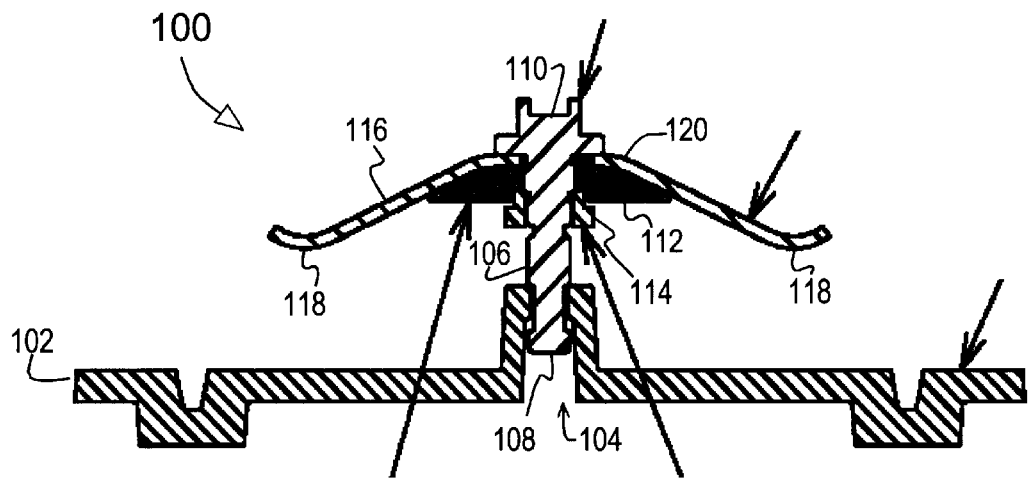
FIG. 1 is a cross sectional view of an embodiment of a heat sink retention assembly according to one embodiment of the present invention.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Generally speaking, the invention contemplates a heat sink retention assembly for use in conjunction with electronic components such as very large scale integrated circuits that generate substantial thermal energy during operation. The assembly includes a spring and a corresponding spring retainer. The spring retainer is configured to maintain the spring in a compressed state characterized by a predetermined spring displacement and a force. When the spring retainer has the spring in the compressed state, a contact portion of the spring exerts a force on a portion of the heat sink. The force exerted on the heat sink by the compressed spring maintains the heat sink in contact with an electronic component, which is typically an integrated circuit such as a general purpose microprocessor. In addition, the assembly includes spring displacement limiter that prevents the spring from being displaced beyond the predetermined displacement. The displacement limiter may be designed into the configuration of the spring itself or implemented as a spacer structure used in conjunction with the spring. The spacer would typically be positioned between a portion of the spring and the heat sink. The spacer is sized so that opposite faces of the spacer just contact the spring and the heat sink when the spring is displaced by the predetermined displacement. Whether incorporated into the spring itself or implemented as a separate component, the displacement limiter prevents vertical displacement of the heat sink relative to spring and spring retainer so that the force exerted on the heat sink by the spring is maintained within a precise window. By precisely controlling the exerted force, the heat sink retention assembly prevents a drop in exerted force due to mechanical shock that could result in undesired movement of the heat sink while simultaneously preventing a significant increase in exerted force that could undesirably result in mechanical stress or damage to the heat sink or electronic component.

Figure 2:
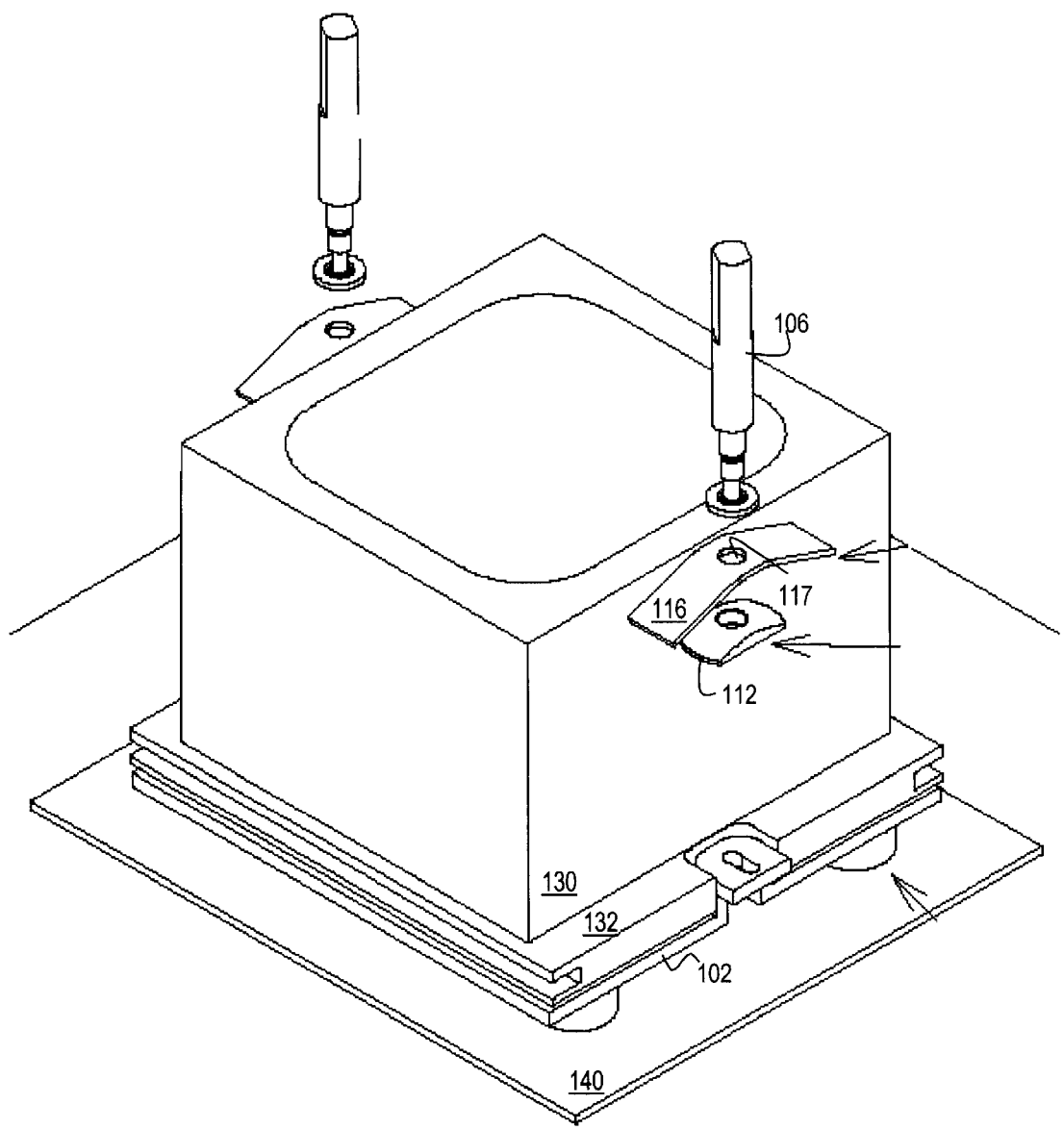
FIG. 2 is a view of selected components of the heat dissipation elements in a data processing system employing a heat sink retention assembly according to the present invention.

Turning now to the drawings, FIG. 1 and FIG. 2 illustrate a heat sink retention assembly 100 according to one embodiment of the present invention. In the depicted embodiment, assembly 100 includes a spring 116, a spring retention screw 106, and a spring spacer 112. Assembly 100 is configured, when assembled, to exert a predetermined force on a heat sink 130 to maintain the heat sink in contact with an integrated circuit or other electronic component (not depicted).

Figure 3:
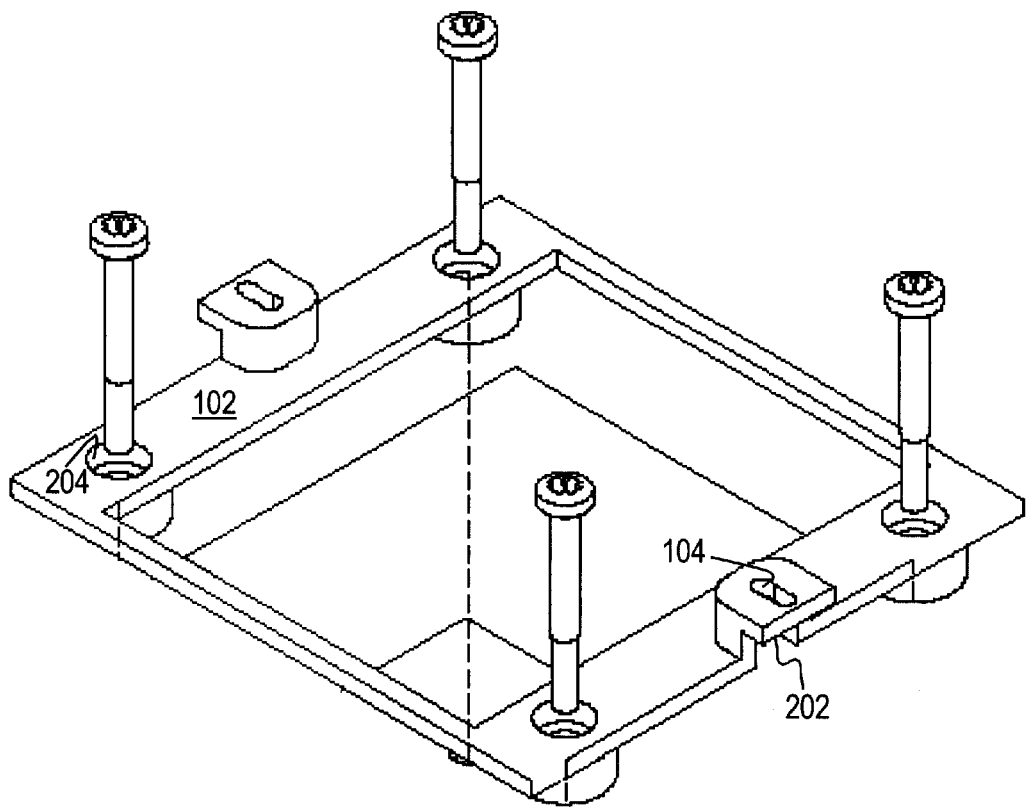
FIG. 3 illustrates a cradle to which the heat sink retention assembly according to the present invention may be affixed.

Spring retention screw 106 includes a proximal end 110 shaped for receiving a screw driver head or other suitable means for turning screw 106 and a distal end 108 suitable for being received within a base or supporting structure. In the depicted embodiment, distal end 108 is received by a receptacle 104 of a cradle 102 that provides a base for heat sink retention assembly 100. The embodiment of cradle 102 illustrated in FIG. 3 includes a set of four holes 204 for securing cradle 102 to a circuit board (planar) 140. Planar 140 may comprise a mother board or other circuit board within a data processing system (not depicted), such as a network server or a desktop, laptop, or network computer, that includes memory, at least one processor, and input/output means as is well known in the field. Cradle 102 further includes a pair of tabs 202, each defining a corresponding receptacle 104 that is suitable for receiving the spring retention screw 106. In other embodiments, planar 140 may receives distal end 108 of screw 106 directly.

Screw 106 may be threaded through a hole 117 in spring 116 and the distal end 108 screwed into receptacle 104 to affix the screw to a supporting structure such as a printed circuit board (planar) 140 or a base piece of the assembly (cradle 102, for example) that is attached to the planar. The proximal end 110 of screw 106 defines an flange 111 having a diameter that is greater than the diameter of the hole 117 in spring 116.

As screw 106 is turned in an appropriate direction (presumably clockwise), flange 111 contacts a bowed portion 120 of spring 116 and forces spring 116 downward. From an initial (high) position in which contact portions 118 of spring 116 are not in contact with heat sink 130, contact portions 118 of spring 116 will eventually contact a ledge 132 of heat sink 130 as screw 106 is turned. Further turning of screw 106 will result in displacement of the bowed portion 120 of spring 116 relative to its contact portions 118 as the spring is compressed by the force of flange 111 on the spring. In this manner, screw 106 is configured to compress spring 116 to obtain an adjustable displacement and to retain the spring in the compressed state.

Figure 6:
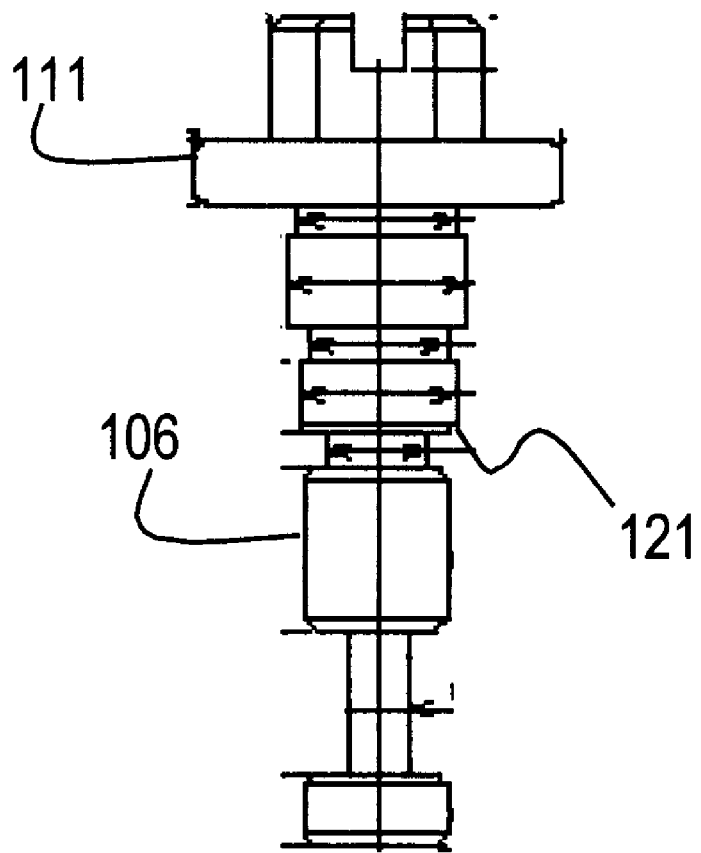
FIG. 6 is a detailed view of an embodiment of a screw suitable for use as a spring retention device.

The spring retainer may be configured to prevent compression of spring 116 beyond the predetermined displacement. Referring momentarily to FIG. 6, a detailed view of an embodiment of screw 106 employing a shoulder stop 121 is depicted. Shoulder stop 121 prevents turning of screw 106 beyond a predetermined limit. When shoulder stop 121 contacts the sidewalls of hole 104 (FIG. 1), the screw "bottoms out" and additional turning of screw 106 does not produce additional spring displacement. Other methods of preventing excessive spring displacement may also be incorporated into spring 116 or any other spring retention device.

Although the embodiment of assembly 100 depicted employs screw 106 as the means for retaining spring 116 in a compressed state, other implementations may employ alternative spring retention devices or structures. For example, the screw 106 could be replaced with a lever or camming structure that compresses spring 116 through via bars and cam lobes.

Spring 116 is comprised of a material having sufficient flexibility to enable the spring to compress under pressure while also having sufficient rigidity to exert a force on heat sink 132 when compressed. The depicted embodiment of spring 116 comprises a shaped strip of a material such as stainless steel. The characteristics of spring 116 such as its rigidity are controlled during spring fabrication by adjusting the length, thickness, material, and other factors. Accordingly, spring 116 can be fabricated to have a predetermined rigidity. Depending upon its rigidity and shape, the force exerted by spring 116 when it is compressed is a function of the spring displacement so that, for a given displacement, spring 116 exerts a corresponding force.

Spring retention screw 106 provides a mechanism for maintaining spring 116 in a compressed state. The compressed state is characterized by a corresponding exerted force and a spring displacement. The desired spring displacement required is typically determined in advance based upon the spring rigidity, the desired force to be exerted on the heat sink, the dimensions of the heat sink, and the dimensions of spring 116.

Ideally, spring 116 is designed with a rigidity that is sufficient to obtain the desired force with a relatively small displacement. If the spring rigidity is too great, however, an undesirably precise displacement may be required to obtain an exerted force value that is within a tolerable window. Imagine, for example, that the spring rigidity translates to a force/displacement ratio of approximately 10 lbs. of force per millimeter of displacement and the desired exerted force is approximately 50 lbs. If screw 106 displaces spring 116 one millimeter/revolution, then the desired force is obtained by rotating screw 106 five revolutions beyond the point at which contact portions 118 of spring 116 first contact the heat sink ledge 132. If the tolerable window of force is +/−5 lbs., then a window of +/− half a turn of screw 106 is acceptable. If, on the other hand, the rigidity of spring 116 is 100 lbs. per millimeter of displacement, screw 106 must be maintained within ½₀ of a turn, which may not be realistic given other tolerance limits in the system. Thus, spring 116 preferably has a rigidity that is within a specified window.

Assembly 100 maintains heat sink 130 in a contact with an electronic component through the force exerted on heat sink 100 by compressed spring 116. It will be appreciated, however, that the heat sink may not be otherwise affixed to assembly 100 or planar 140. If an external force acts on heat sink 130, the force exerted by spring 116 may be reduced or increased beyond tolerable limits. If mechanical shock occurs during shipping or in the field, for example, heat sink 130 could move relative to spring retention screw 106 such that the spring displacement increases or decreases. If the spring displacement decreases sufficiently, spring 116 may exert little or no force on heat sink 130 thereby making the heat sink susceptible to undesirable movement. If the spring displacement increases, spring 116 may exert an excessive force on heat sink 130 resulting in potential mechanical stress or failure of the underlying electronic component, a socket in which the component may be positioned, the planar, or a combination thereof.

The present invention addresses displacement of spring 116 above or below a predetermined displacement by incorporating a spring displacement limitation into assembly 100. In the embodiment depicted in FIGS. 1 and 2, the spring displacement limiter is implemented with a spacer structure 112 that serves as a stop for displacement of heatsink 130. Spacer 112 as depicted includes a cast piece that defines a hole 113 suitable for receiving screw 106. When assembled, an upper surface of spacer 112 is in contact with or in close proximity to the bowed portion 120 of spring 116. In the depicted embodiment, spacer 112 is maintained in its position by a collar 114 affixed to screw 106.

Figure 4:
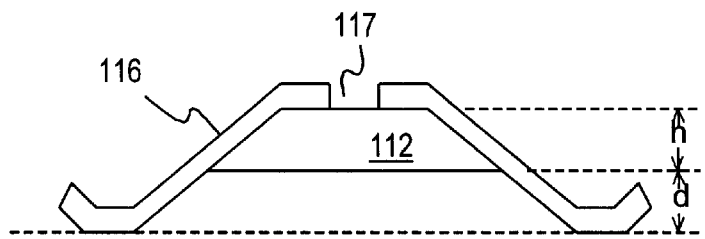
FIG. 4 illustrates selected elements of a heat sink retention assembly according to an embodiment of invention employing a spacer structure.

Spacer 112 has a vertical dimension that prevents heat sink 130 from displacing spring 116 significantly beyond the predetermined displacement. When spring 116 is in the compressed state with a predetermined spring displacement, a lower surface of spacer 112 is in close proximity to or just contacts heat sink 130 thereby preventing significant displacement of spring 116. In the embodiment depicted in FIG. 4, spacer 112 has a vertical dimension (height) indicated by the letter "h". The displacement of spring 116 required to obtain the desired exertion force is indicated by the letter "d". The total possible displacement of spring 116 is equal to the sum h+d. By inserting spacer 112 between spring 116 and heat sink 130 such that a first face of spacer 112 is in contact with spring 116, the height of spacer 112 limits displacement of spring 116 to the desired displacement d. When the displacement of spring 116 is equal to d, the first face of spacer 112 is in contact with spring 116 while a second face of spacer 112 is in contact with the heat sink. Because spacer 112 is comprised of a substantially rigid material such as cast steel, spacer 112 prevents further displacement of the spring beyond the desired value.

In an embodiment where it may be desirable to permit heat sink 130 to displace spring 116 slightly beyond the predetermined displacement under sudden force, the height of spacer 112 may be slightly less than h. In this embodiment, a gap exists between the lower surface of spacer 112 and heatsink 130 when assembly 100 is in place with spring 116 displaced by the predetermined displacement. Under mechanical shock or other abnormal environmental condition, the small gap between heatsink 130 and spacer 112 would permit heat sink 130 to be forced away from its electronic component temporarily. Spring 116 would then be compressed slightly beyond the predetermined displacement with a corresponding increase in the force exerted on heat sink 130. When the abnormal environmental condition ceases, spring 116 would force heatsink 130 back to its equilibrium condition with spring 116 displaced at the predetermined displacement.

Figure 5:
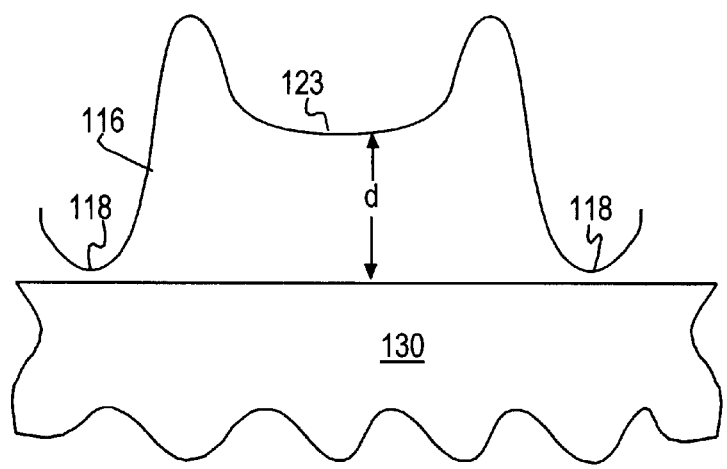
FIG. 5 illustrates an alternative embodiment of a spring suitable for use in a heat sink retention assembly according to the present invention.

The displacement limiting feature of assembly 100 may be incorporated into the configuration of spring 116 such that the need for a spacer structure as described above is obviated. Referring to FIG. 5, an embodiment of spring 116 configured to incorporate a displacement limitation mechanism is depicted. In this embodiment, the configuration of spring 116 has a self limiting displacement. In this embodiment, spring 116 includes a displacement portion 123 that will contact the surface of heat sink 130 when the spring is displaced by the displacement "d". Dependent upon the configuration parameters of spring 116 including the material, thickness, and dimensions of spring 116, the contact portions 118 of spring 116 will exert the desired predetermined force on heat sink 130 precisely when the displacement portion 123 is forced into contact with heat sink 130 by the action of the spring retention device (whether it be a screw or other retention device). In this embodiment, the heat sink retention assembly 100 eliminates a component (the spacer structure) in exchange for a spring of slightly greater complexity.

It will be apparent to those skilled in the art having the benefit of this disclosure that the present invention contemplates an assembly for improved heat sink retention for use in a system such as a data processing system. It is understood that the form of the invention shown and described in the detailed description and the drawings are to be taken merely as presently preferred examples. It is intended that the following claims be interpreted broadly to embrace all the variations of the preferred embodiments disclosed

What is claimed is:

1. An assembly for retaining a heat sink in contact with an electronic component, comprising:
    a spring;
    a spring retainer configured to maintain the spring in a compressed state characterized by a predetermined spring displacement wherein a contact portion of the spring applies a predetermined force to a heat sink; and
    a spacer positioned between a portion of the spring and the heat sink and sized to limit vertical displacement of the heat sink relative to the spring retainer to prevent displacement of the compressed spring substantially beyond the predetermined spring displacement.

2. The assembly of claim 1, wherein the spacer structure contacts the portion of the spring and the heatsink when the spring is in the compressed state.

3. The assembly of claim 1, wherein a gap exists between the spacer structure and the heatsink when the spring is in the compressed state.

4. The assembly of claim 1, wherein the spring comprises a bowed strip of a substantially rigid material.

5. The assembly of claim 4, wherein the strip comprises a bowed portion displaced between a pair of contact portions.

6. The assembly of claim 5, wherein the bowed portion of the strip defines a hole suitable for receiving a first end of the spring retainer.

7. The assembly of claim 1, further comprising a supporting structure wherein the spring retainer comprises a screw having a proximal end suitable for contacting the spring and a distal end suitable for attaching to the support structure.

8. The assembly of claim 7, wherein the supporting structure comprises a cradle affixed to a planar, and wherein the distal end of the screw attaches to a hole in the cradle.

9. The assembly of claim 7, wherein the screw includes a shoulder stop that prevents the screw from displacing the spring beyond the predetermined displacement.

10. An assembly for retaining a heat sink in contact with an electronic component, comprising:
    a spring;
    a screw having a proximal end suitable for contacting the spring and a distal end suitable for attaching to a supporting structure and wherein the screw is configured to maintain the spring in a compressed state characterized by a predetermined spring displacement wherein a contact portion of the spring applies a predetermined force to a heat sink; and
    a spacer configured to prevent displacement of the compressed spring substantially beyond the predetermined spring displacement.

11. The assembly of claim 10, wherein the spacer is positioned between a portion of the spring and the heat sink and sized to limit vertical displacement of the heat sink relative to the spring retainer.

12. The assembly of claim 10, wherein the spacer contacts the portion of the spring and the heatsink when the spring is in the compressed state.

13. The assembly of claim 10, wherein a gap exists between the spacer and the heatsink when the spring is in the compressed state.

14. The assembly of claim 10, wherein the spring comprises a bowed strip of a substantially rigid material having a bowed portion displaced between a pair of contact portions.

15. The assembly of claim 10, wherein the assembly includes the supporting structure and wherein the supporting structure comprises a cradle affixed to a planar, and wherein the distal end of the screw attaches to a hole in the cradle.

16. The assembly of claim 10, wherein the screw includes a shoulder stop that prevents the screw from displacing the spring beyond the predetermined displacement.

* * * * *